United States Patent
Chaji

(10) Patent No.: US 12,362,338 B2
(45) Date of Patent: Jul. 15, 2025

(54) TILED DISPLAY FOR OPTOELECTRONIC SYSTEM

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 539 days.

(21) Appl. No.: 17/440,883

(22) PCT Filed: Mar. 20, 2020

(86) PCT No.: PCT/IB2020/052641
§ 371 (c)(1),
(2) Date: Sep. 20, 2021

(87) PCT Pub. No.: WO2020/188542
PCT Pub. Date: Sep. 24, 2020

(65) Prior Publication Data
US 2022/0165717 A1    May 26, 2022

Related U.S. Application Data

(60) Provisional application No. 62/821,140, filed on Mar. 20, 2019.

(51) Int. Cl.
*H10K 59/18* (2023.01)
*H01L 25/075* (2006.01)
(Continued)

(52) U.S. Cl.
CPC .......... *H01L 25/13* (2013.01); *H01L 25/0753* (2013.01); *H01L 25/167* (2013.01);
(Continued)

(58) Field of Classification Search
CPC ............................. H10K 59/18; H01L 25/0753
See application file for complete search history.

(56) References Cited

U.S. PATENT DOCUMENTS 6,459,418 B1 * 10/2002 Comiskey .............. B41J 3/4076
349/86
2002/0001051 A1 * 1/2002 Krusius ............... G02F 1/13336
349/73
(Continued)

FOREIGN PATENT DOCUMENTS

| CN | 101852914 A | 10/2010 |
|---|---|---|
| JP | 2003216072 A | 7/2003 |
| TW | 201840015 A | 11/2018 |

OTHER PUBLICATIONS

PCT Intenational Searching Authority, Written Opinion and International Search Report relating to application No. PCT/IB2020/052641 dated Jun. 2, 2020.
(Continued)

*Primary Examiner* — Kevin Parendo

(57) ABSTRACT

The present invention discloses structures and methods for making tiled displays for optoelectronic systems. The invention provides for a method of making a micro device tiled display. The method provides a tile substrate having a plurality of tiles. The method provides for a backplane layer. The method provides for covering a first surface of one of the backplane layer or the tile substrate with an adhesive. The method provides for aligning and releasing the tiles to the backplane. The method provides for curing the adhesive. The method provides for filling an area or a trench between the plurality of tiles and an area or trench between micro devices with a filler layer, wherein the filler layer is extended to either side of the tile depending on the view direction.

16 Claims, 13 Drawing Sheets

(51) Int. Cl.
*H01L 25/13* (2006.01)
*H01L 25/16* (2023.01)
*H10H 20/855* (2025.01)
*H10H 20/01* (2025.01)

(52) U.S. Cl.
CPC ........... *H10H 20/855* (2025.01); *H10K 59/18* (2023.02); *H10H 20/0363* (2025.01)

(56) References Cited

U.S. PATENT DOCUMENTS

| | | | |
|---|---|---|---|
| 2002/0173215 A1 | 11/2002 | Freidhoff et al. | |
| 2005/0140569 A1* | 6/2005 | Sundahl | G09F 9/3026 345/1.3 |
| 2010/0277064 A1* | 11/2010 | Cok | H10K 59/18 313/506 |
| 2011/0057861 A1* | 3/2011 | Cok | H10K 59/18 345/1.3 |
| 2017/0207284 A1 | 7/2017 | Dykaar | |

OTHER PUBLICATIONS

CNIPA: CN Decision relating to CN application No. 109109359, dated Sep. 30, 2024.
ROC: TW Office Action relating to TW application No. 109109359, dated Feb. 2, 2024.
CNIPA: CN Office Action relating to CN application No. 202080015106.2, dated Mar. 28, 2024.
CNIPA: CN Office Action relating to CN application No. 202080015106.2 Jul. 26, 2024.
ROC: TW Office Action relating to TW application No. 109109359, dated Feb. 15, 2024.
CNIPA: CN Office Action relating to CN application No. 202080015106.2, dated Jan. 10, 2025.
CNIPA: CN Office Action relating to CN application No. 202080015106.2, dated Mar. 13, 2025.

* cited by examiner

TILED DISPLAY FOR OPTOELECTRONIC SYSTEM

CROSS-REFERENCE TO RELATED APPLICATION(S)

This application claims priority to and benefit of U.S. Provisional Patent Application No. 62/821,140, filed Mar. 20, 2019, which is hereby incorporated by reference herein in its entirety.

BACKGROUND AND FIELD OF THE INVENTION

The present disclosure relates to tiled display devices and more particularly, to the seamless integration of tiles to a backplane to form the tiled display device. Previously, tile light emitting diode (LED) approaches used mechanics to organize and hold tiles together. These approaches were adjustable and therefore the tiles could be moved around and/or taken apart and put back together in a variety of formations.

SUMMARY

The present invention relates to a method of making a tiled display. The method may comprise of providing a tile substrate having a plurality of tiles, providing a backplane layer, covering a first surface of one of the backplanes or the tile substrate with an adhesive, aligning and releasing the tiles to the backplane, curing the adhesive and filling an area or a trench between the plurality of tiles and an area or trench between micro devices with a filler layer, wherein the filler layer is extended to either side of the tile depending on the view direction.

The present invention also relates to a tiled display that may comprise one or more micro devices transferred to a substrate, and a passthrough pad formed on a top surface of the substrate to pass a backplane to the top surface.

The present invention also relates to a tiled display comprising one or more micro devices transferred to a substrate, a patterned planarization layer to provide openings for connecting the micro devices, a pad electrode deposited and patterned on or over the micro devices; and a common pad formed on a top surface of the pad electrode.

BRIEF DESCRIPTION OF THE DRAWINGS

The foregoing and other advantages of the disclosure will become apparent upon reading the following detailed description and upon reference to the drawings.

Figure 1:
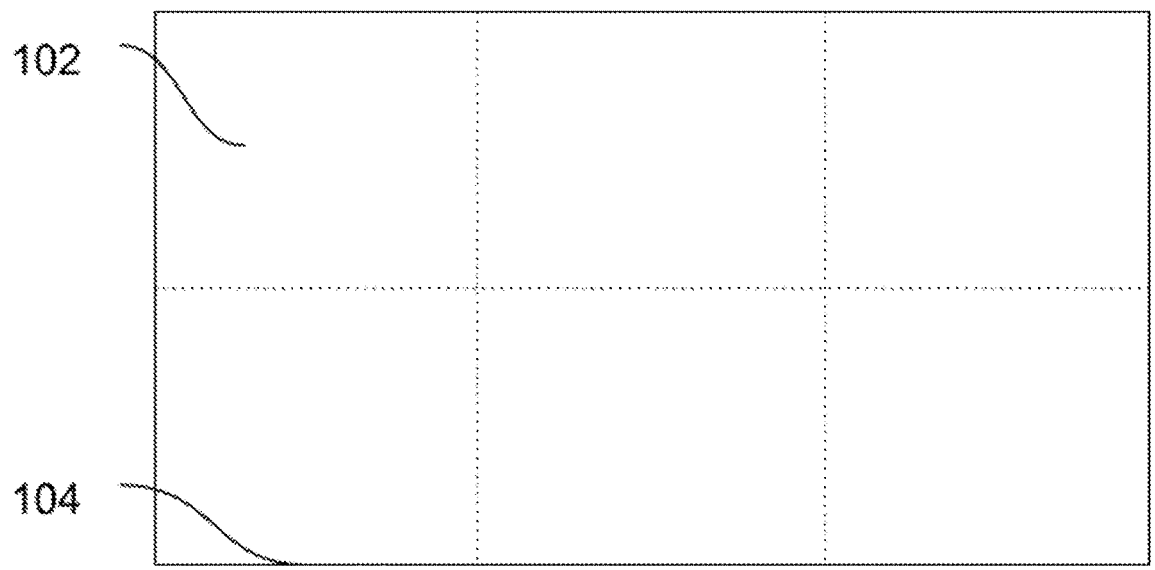
FIG. 1 shows an example of several transferred tiles aligned on a substrate.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

In this description, the term "device" and "micro device" are used interchangeably. However, it is clear to one skilled in the art that the embodiments described here are independent of the device size.

This disclosure attempts to build a more permanent and non-adjustable tile integration, with a slimmer profile for consumer use. Similarly, where previous art was ideal for very large displays in which the seamlessness of the tiles was not as crucial (i.e., since human eyes did not look at the screen close up), this disclosure addresses a more seamless integration for smaller displays that are closer to the human eye and therefore may be more easily deduced to have imperfections.

In a large display, one damaged or defective micro device may render an entire display useless. However, when a tile LED integration is used for a display, each tile may contain a controlled number of LEDs which may be tested for satisfactory performance (i.e., micro devices with defects are identified). Then, once their performance is determined to be acceptable, they may be transferred to the system substrate as a single tile which is aligned with other similarly tested and acceptable tiles. If the LEDs on a tile are broken, defective, or damaged, this tile may be omitted from the transfer process, or adjusted after the transfer process to the system substrate, and therefore reduce the likelihood that the entire display is unusable.

In one embodiment, a display tile may comprise one or more micro devices mounted on a surface on the display tile. The micro device array may comprise microLED's, organic LEDs, sensors, solid state devices, integrated circuits, microelectromechanical systems (MEMS), and/or other electronic components.

In another embodiment, a transfer substrate may be provided. The transfer substrate may be, but is not limited to, a printed circuit board (PCB), thin film transistor (TFT) backplane, integrated circuit substrate, or, in one case of optical micro devices such as LEDs, a component of a display, for example a driving circuitry backplane.

In some embodiments, micro devices may be tested for defects and fixed, adjusted, or removed before being transferred to the tile, to increase uniformity and limit defects in the display.

In alternative embodiments, micro devices may be tested for defects and fixed or adjusted after being transferred to the tile to increase uniformity and limit defects in the display.

In some embodiments, a buffer layer may be provided on a top surface of the tile substrate. In one case, the buffer layer may be an adhesive layer. In addition, the buffer layer may be a release layer or tile transferable substrate which can be separated from the main substrate that the buffer layer is formed on top of it.

In one embodiment, one or more micro devices may be formed or transferred on the buffer layer.

In another embodiment, one or more planarization layers may be formed on or over the micro devices. The planarization layer may be made of organic insulating material and patterned to expose a top of the micro devices.

In one embodiment, a separate backplane may be prepared. An adhesive layer may be deposited to cover a first surface of the backplane.

In another embodiment, one or more tiles may be aligned to the backplane. A pressure may be applied, and the one or more tiles may be aligned. In one case, temperature, light, or microwave exposure may be used to cure the adhesive layers. In one case, extra residual adhesive may be cleaned after curing takes place.

In another embodiment, a separation layer may be provided to optically isolate the micro device from the backplane. The separation layer may be patterned and may be one of a reflector, opaque, or black matrix layer.

In one embodiment, a seamless micro device tile array comprises micro device tiles aligned and filled with black matrix to reduce light outcoupling.

In a variation of the above embodiment, this seamless array may include trenches filled with black matrix to reduce light outcoupling. In one case, these trenches may be filled with a reflective material. In another case, the reflective material may be patterned before or after the array is assembled. The trench filler may be opaque.

Various embodiments in accordance with the present structures and processes provided are described below in detail.

Any area between pixels or tiles (i.e., when they are not perfectly aligned) may be obvious to the observer. Therefore, this disclosure furthermore aims to present a seamless tile array that uses additional structure such as reflective layers, fillers, black matrix, and/or other layers to improve the outcoupling of the generated LED light (e.g., cover any imperfections and open areas that a human eye could detect).

FIG. 1 shows an example of several transferred tiles 102 seamlessly aligned on a substrate 104.

Figure 2:
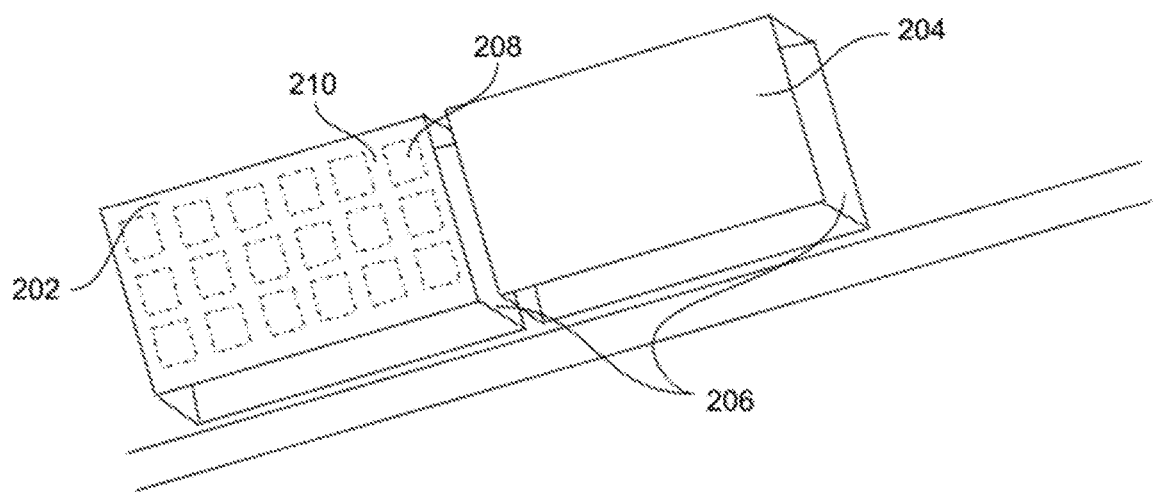
FIG. 2 shows an example of a tile array with optical illusion techniques in use, according to one embodiment of the present invention.

FIG. 2 shows two aligned tiles 202 and 204, which may be referred to as tile 1 and tile 2 respectively. The area/space 206 between the adjacent tiles 202 and 204 may be filled with a filler layer. In one case, the area/space 206 between the tiles may be filled with a black matrix. The black matrix may be made out of resins such as polyimide or polyacrylic in which particles of black pigment such as carbon black were dispersed. The thickness of the black matrix may be patterned or etched. In another case, the filler layer may be reflective or opaque, and patterned.

In the case of a transparent display, the area/space 206 may be filled with transparent materials. In this case, the material can be similar to that was used to make the tiles.

In one case, extra trenches 210 with the same width as the space between the two tiles (202, 204) or the pitch of the micro devices at the edge of the two tiles may be created between the plurality of the pixels e.g., 208 (in one example, this may include more than one pixel). These trenches 210 may also be grooved and filled a filler layer. In one case, the filler layer may be a black matrix or another transparent material as those used to fill the gap between the tiles to further reduce the tiles visibility. If this filler layer is reflective, it may be patterned. These trenches may have a set pattern, or the pattern may be extracted after the tile is created. If the micro devices are at the bottom side of the tile, the trenches may be implemented at the surface closer to the micro devices.

In another case, a second layer can be deposited on top of tiles similar to the material used to fill the area/space 206 of the tile. In this case, there can be an opening in the area/space 206 of filler layer, especially if the material is opaque.

In one embodiment, there can be connection between the tiles and the substrate (or backplane) 310.

Figure 3A:
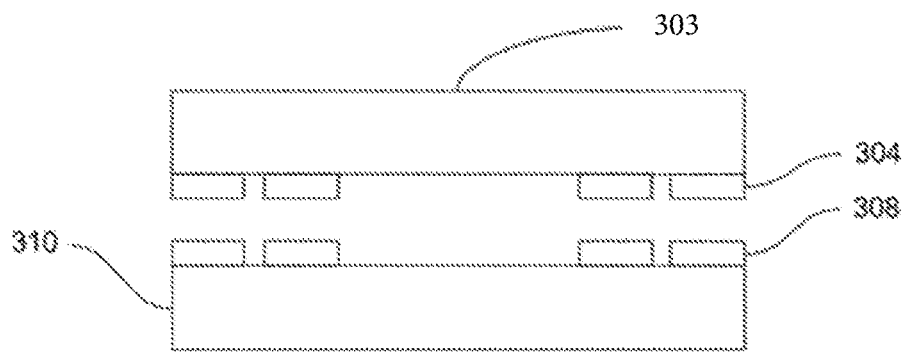
FIG. 3A shows an embodiment of backplane contact pads aligned with the contact pads on a tile substrate.

FIG. 3A, shows an embodiment wherein backplane contact pads aligned with the contact pads on a tile substrate. The contact pads 304 for an array of micro devices on tile substrate 303 may be aligned and connected to contact pads 308 on a surface of the backplane 310 to form a tiled display.

There can be a filler layer between the pads and other spaces between the tile substrate 303 and the backplane 310. This filler can be adhesive.

Figure 3B:
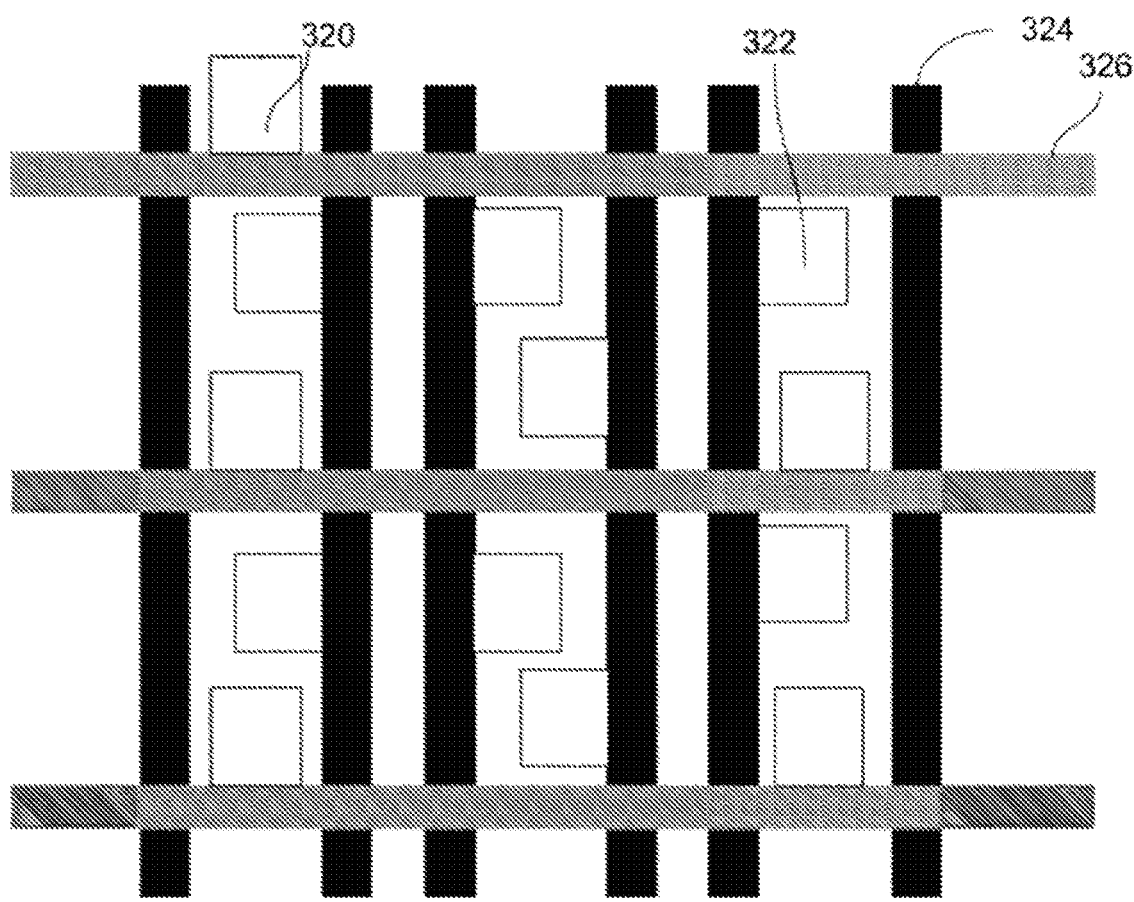
FIG. 3B shows an electrode structure on the substrate with signals to control an array of micro devices.

FIG. 3B shows an electrode structure on the substrate 310 with signals to control an array of micro devices. The signals are stretched in vertical and horizontal directions (or any other two directions). There are horizontal or vertical pads (320, 322) connected to the signal lines (e.g., vertical 324 and horizontal 326 signal lines). These pads will be bonded to the corresponding areas on the tile 302. The signal lines (324, 326) can carry data, address, operating voltages, and/or enable signals. In one case, the pads are not formed directly on the lines to avoid damaging the lines from the pressure applied during the bonding process. In another case, there can be multiple pads for each signal across the tile to improve bonding yields.

Figure 3C:
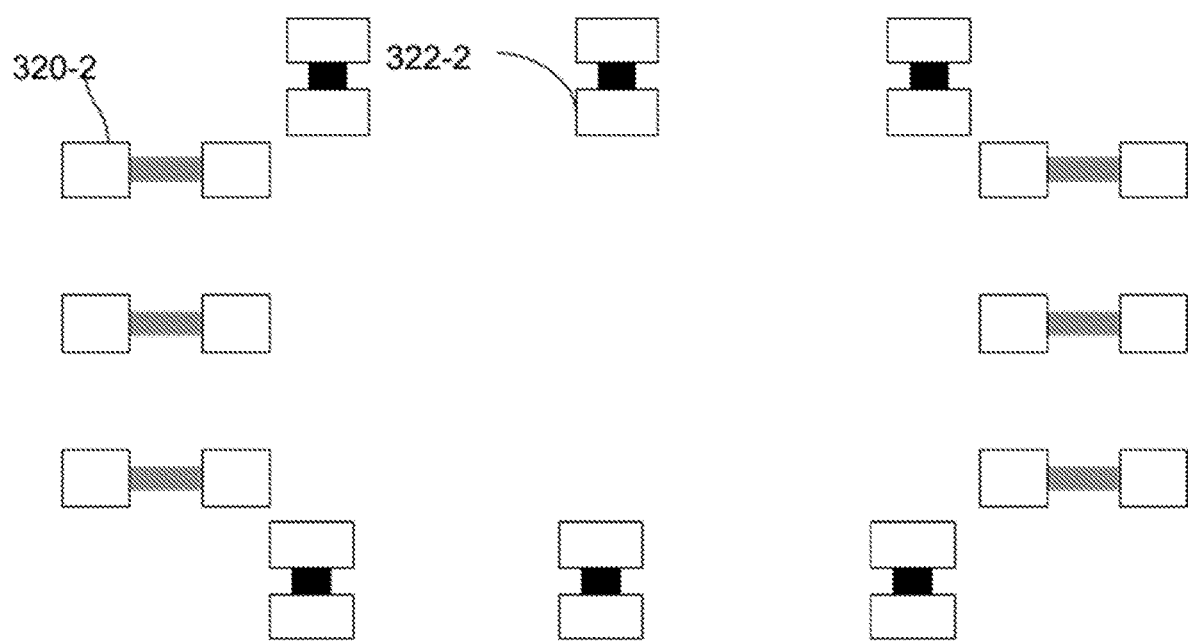
FIG. 3C shows another structure where the signals are passed between the tiles through some connections on the substrate.

FIG. 3C shows another structure where the signals are passed between the tiles 302 through some connections on the substrate 310. Here, the signals from one pad (either horizontal 320-2 or vertical 322-2) passes through the tile, are extended through the tile and then go to another pad on the substrate 310. This will then be passed to another tile through a trace and a pad coupled to the said pads. This structure can be more beneficial for transparent displays as there is less metallization on the substrate to block or reflect the light.

Figure 3D:
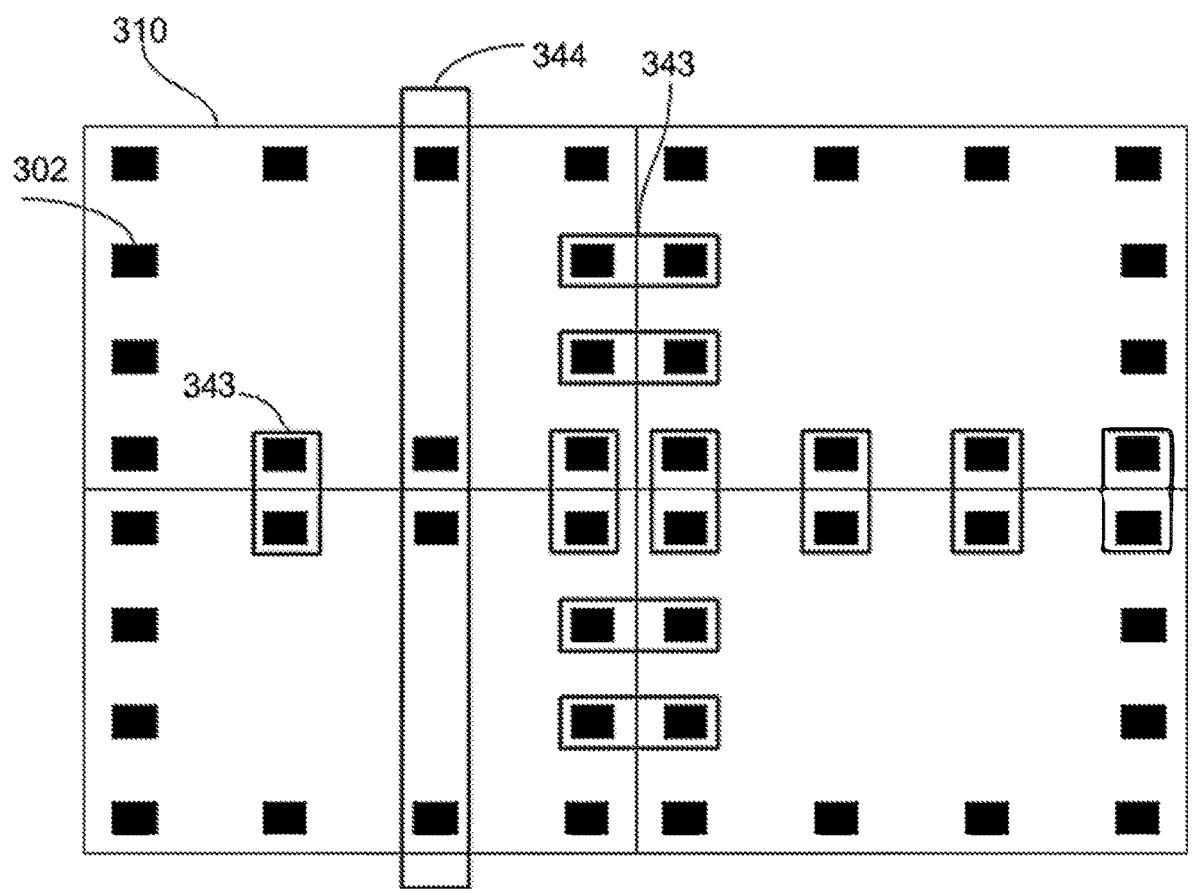
FIG. 3D shows a structure where the tiles are transferred to the substrate and connections between the tiles are formed after the transfer.

FIG. 3D shows a structure where the tiles are transferred to the substrate 310 and connections between the tiles are formed after the transfer. Here, either extended signal lines or bridge lines can be used to pass the signals between or through the tiles 302. As well, the traces or bridges are deposited, printed, or electroplated. There are pads 343 on top of the tiles (i.e., the surface that is away from the substrate 310). There can be a dielectric layer 344 on the top surface of the tile that needs to be opened to expose the pads. The traces and bridges can be metal, conductive oxides, conductive polymers, and so on.

Figure 3E:
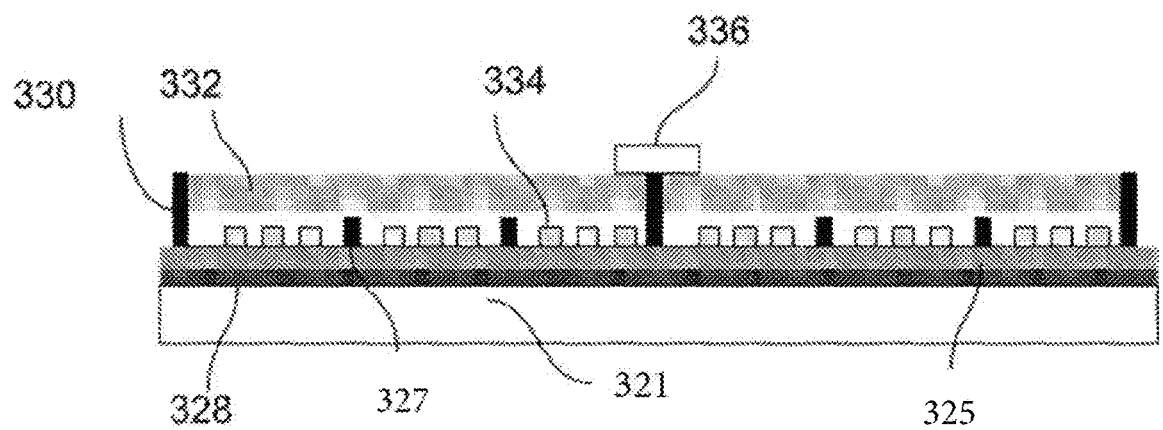
FIG. 3E shows a cross-sectional view of the tile structure with top metallization.

FIG. 3E shows a cross-sectional view of the tile structure with top metallization (i.e., forming traces and or bridges). Here, the area between the tiles is filled with some filler 330 (i.e., tile filler). The same filler can be used to cover the top surface of the tile as well. The tiles are bonded to the substrate 321 through an adhesive layer 328. There can be a buffer layer(s) 325. The buffer layer 325 can be reflective for a top emission structure or it can be transparent for bottom emission devices. The buffer layer can be formed on the substrate 321 or the tile structure. The metallization 336 for traces and bridges are formed between the tiles over the tile filler layer 330. There can be a matching filler structure 327 formed between the plurality of micro devices 334 to reduce the effect of tile spaces. The matching filler structure 327 can be extended to either side of the tile depending on the view direction. In one case, dummy traces can be placed on top of the tiles to hide the tiles seems. In another case, a backplane 332 may be bonded to the plurality of micro devices 334.

Figure 3F:
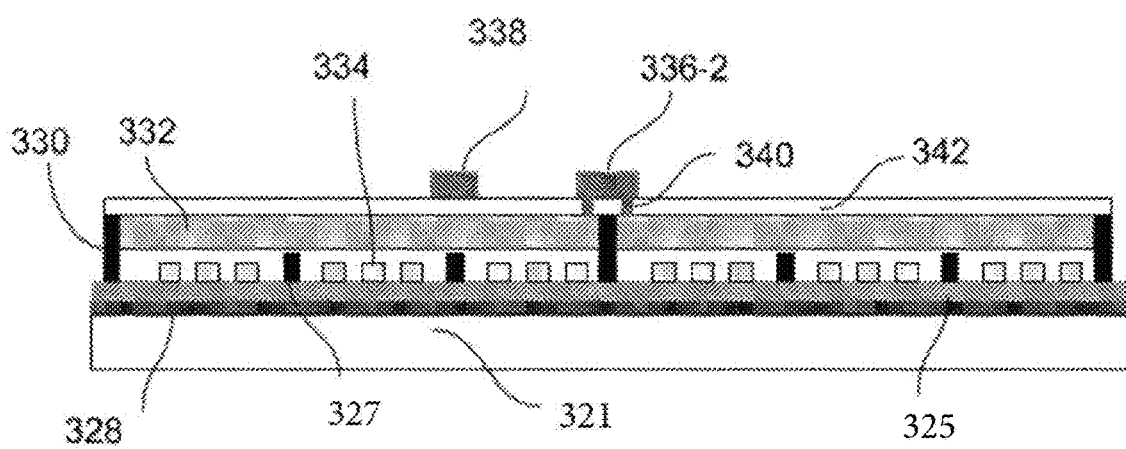
FIG. 3F shows another exemplary case of the tile structure with top metallization.

FIG. 3F shows another exemplary case of the tile structure with top metallization. Here, a planarization layer/dielectric layer 342 is deposited on top of the tiles after or before being bonded to the substrate 321. The dielectric layer can be the same material as the filler layer. The pads on the tiles get exposed prior to the formation of the traces or bridges. An opening/via 340 may be made through the dielectric layer 342 to provide metallization 336-2 for traces and bridges formed between the tiles over the tile filler layer 330. A pattern 338 which matches the matching filler structure 327 may be applied to the tile to further reduce any tile effects.

Figure 3G:
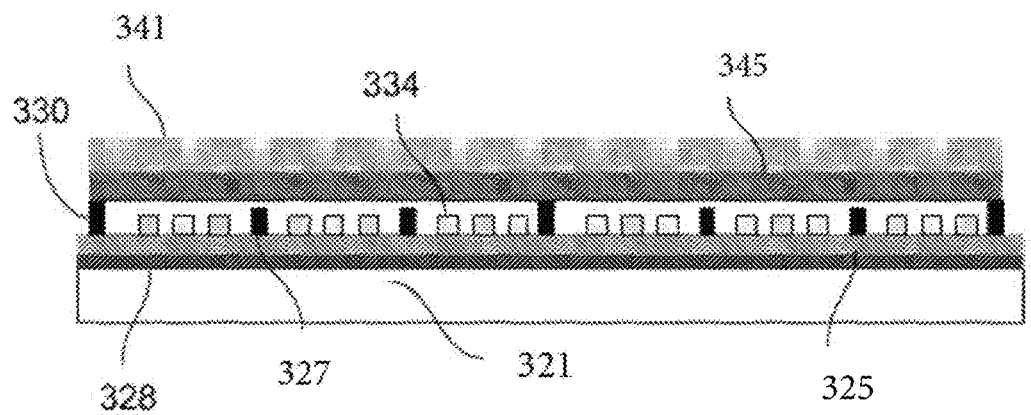
FIG. 3G shows another exemplary embodiment of the tile structure where part of the backplane is formed after the tiles are bonded into the substrate.

FIG. 3G shows another exemplary embodiment of the tile structure where part of the backplane 341 is formed after the tiles are bonded into the substrate 321. Here, planarization, dielectric, or protection layer 345 can be formed on top of the tiles and the backplane 341 is formed on top of that layer 345. The backplane can be a thin-film transistor (TFT), complementary metal-oxide-semiconductor (CMOS) chiplet or other type.

Figure 4:
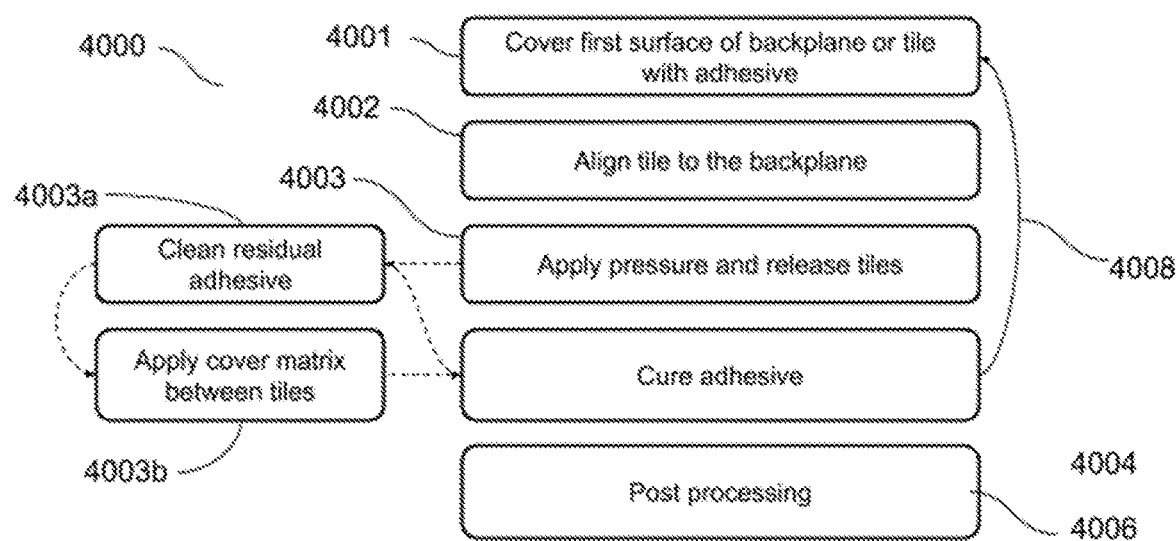
FIG. 4 shows a flow chart illustrating a method of the present invention.

FIG. 4 shows a process flowchart 4000 of a potential tile integration. In step 4001, the first surface of the backplane is covered with adhesive materials. The adhesive can have some special properties such as optical transparency or thermal conductivity. The pads may get exposed after the adhesive layer deposition on the surface of the backplane. Adhesive materials can be applied to the surface of the tile as well. Then, tiles are aligned with the first surface of the backplane in step 4002. Applying pressure in step 4003 releases the tiles on the first surface of the backplane. Next, the adhesive may be cured in step 4004 (Cure Adhesive). Before taking step 4004, residual adhesive may be cleaned in step 4003a and black matrix may be applied between the tiles in step 4003b. Both steps 4003a and 4003b may be repeated after step 4004 or skipped completely. These steps may also be repeated (repeat loop 4008) as many times as necessary after step 4004. Applying black matrix in step 4003b limits the opportunity for light to escape between the tiles, and also covers up any imperfections from tile cutting. During the final step, post processing may be applied to the tiles or the substrate.

Figure 5A:
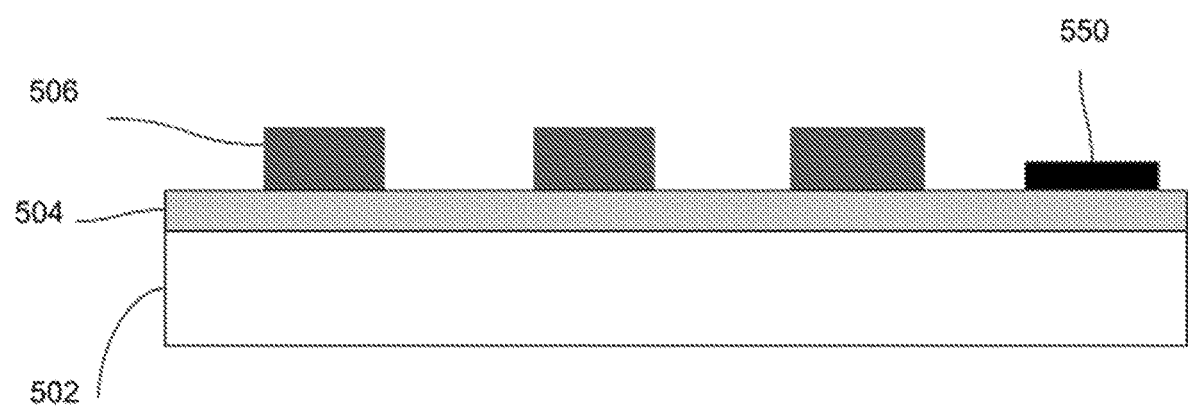
FIG. 5A is a cross-sectional view of a micro device array on a substrate, according to one embodiment of the present invention.

With reference to FIG. 5A, an embodiment of the present invention comprises a substrate 502. The substrate may be glass, sapphire, or some other material. A buffer layer 504 may be provided on the substrate. In one case, the buffer layer can be a release layer or tile transferable substrate which can be separated from the main substrate that the buffer layer is formed on top of it. One or more micro devices 506 may be formed or transferred on the buffer layer 504. In one case, a passthrough pad 550 can be formed on the surface of the substrate 502 or buffer layer 504 to pass the backplane or other layer signals to the top. In one case, the structure in FIG. 5A can be bonded to another substrate from the substrate 502 side and the active surface of the device can be away from the substrate 502. In this case, a separation film closer to the micro device layer 506 can form to create the illusion of hiding the depth of substrate 502. Here the area between the tile substrates 506 can be filled with similar material as the isolation layer or the top surface can be the same material as the isolation layer. As a result, the active depth of the structure will be from the isolation layer toward the surface. In this case, the isolation layer can form first on the surface of the substrate 502 before the micro devices 506 are formed on the surface. Here, the space between micro devices and the space between the substrate after the isolation layer can be filled with a filler layer.

Figure 5B:
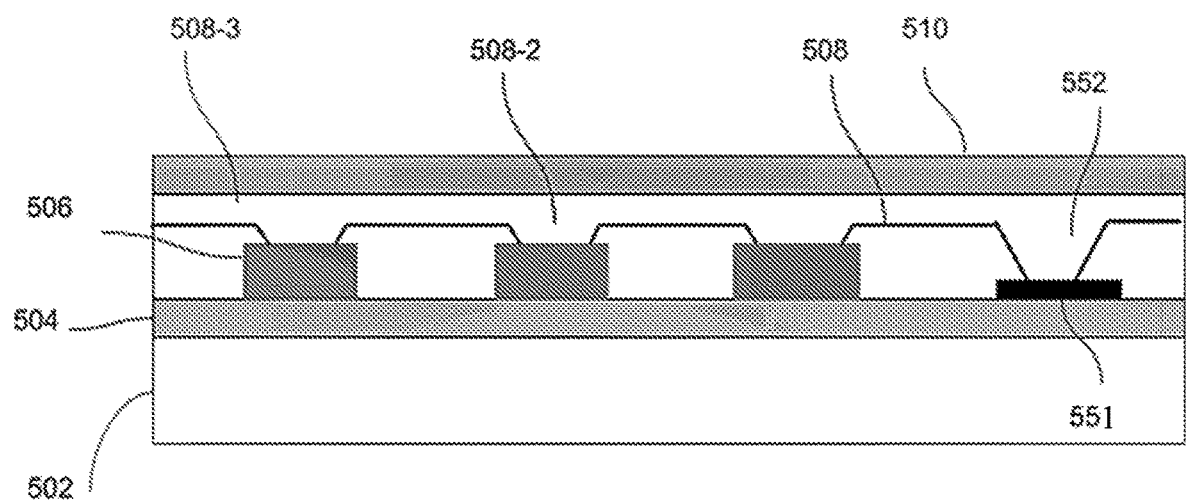
FIG. 5B is a cross-sectional view of a micro device array on a substrate with a planarization layer, according to one embodiment of the present invention.

With reference to FIG. 5B, one or more planarization layers 508 may be formed on or over the micro devices 506. The planarization layer 508 may be made of organic insulating material and patterned to expose a top 508-2 of the micro devices. The planarization layer 508 may also be etched back to either reduce its thickness or expose the surface of the micro device. Also, the top of the backplane passthrough pad 551 can be exposed 552. A backplane 510 may be formed above the planarization layer 508. A passivation, planarization, or protection layer 508-3 can be formed on the layer 508. A metal layer can be part of layer 508-3. The backplane is coupled to the micro devices and passthrough pads through the exposed areas 508-2 and 552.

The planarization layer rests on top of micro devices 506, which are formed on buffer layer 504 and stay on substrate 502.

Figure 5C:
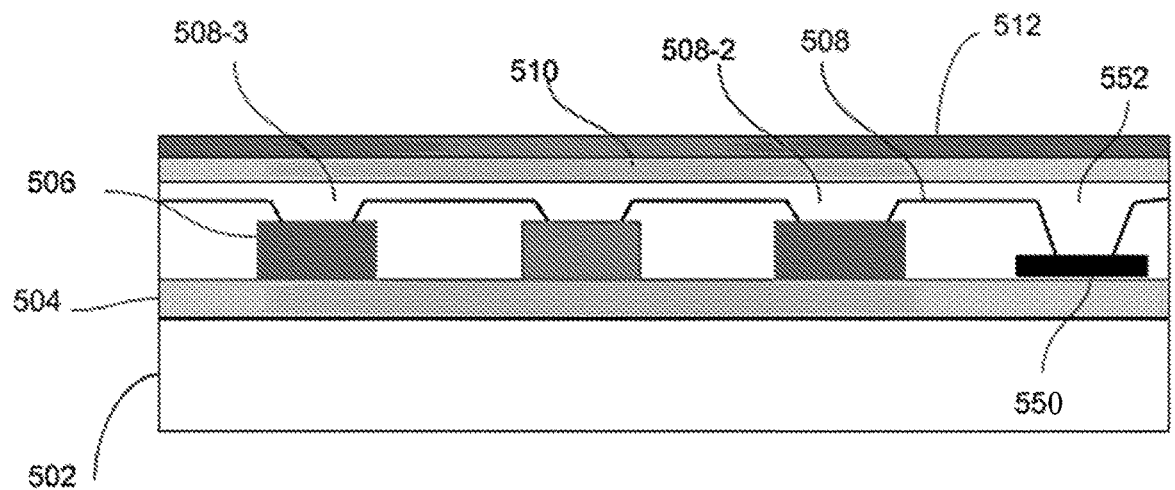
FIG. 5C is a cross-sectional view of a micro device array that includes a separation layer, and is bonded to a backplane, according to one embodiment of the present invention.

FIG. 5C is a cross-sectional view of a micro device array that includes a separation layer, and a backplane is formed on top surface of the micro device layer (the surface away from the substrate 502), according to one embodiment of the present invention. A separation layer 510 may be formed between the micro devices 506 and the backplane 512. The separation layer 510 may optically isolate the micro devices 506 from the backplane 512. This separation layer 510 may be but is not limited to a reflective, opaque, black matrix, or patterned layer. This separation layer 510 helps to reduce the effects of the backplane on the micro devices 506. Layer 510 may be added either after the micro devices 506 (i.e., on top), as shown in FIG. 5C, or it may be added to the structure before the micro devices 506.

Figure 5D:
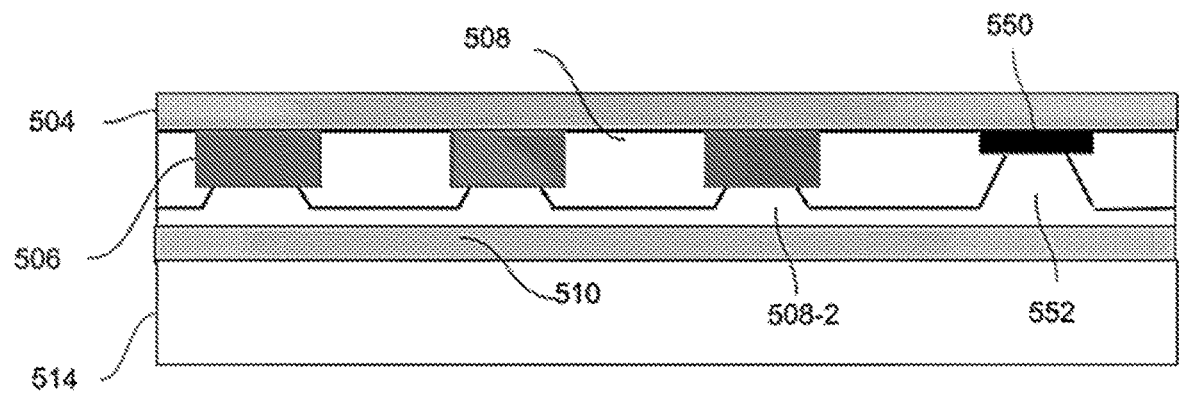
FIG. 5D is a cross-sectional view of a micro device array that includes an adhesive layer, and is bonded to a backplane, according to an embodiment of the present invention.
Figure 5E:
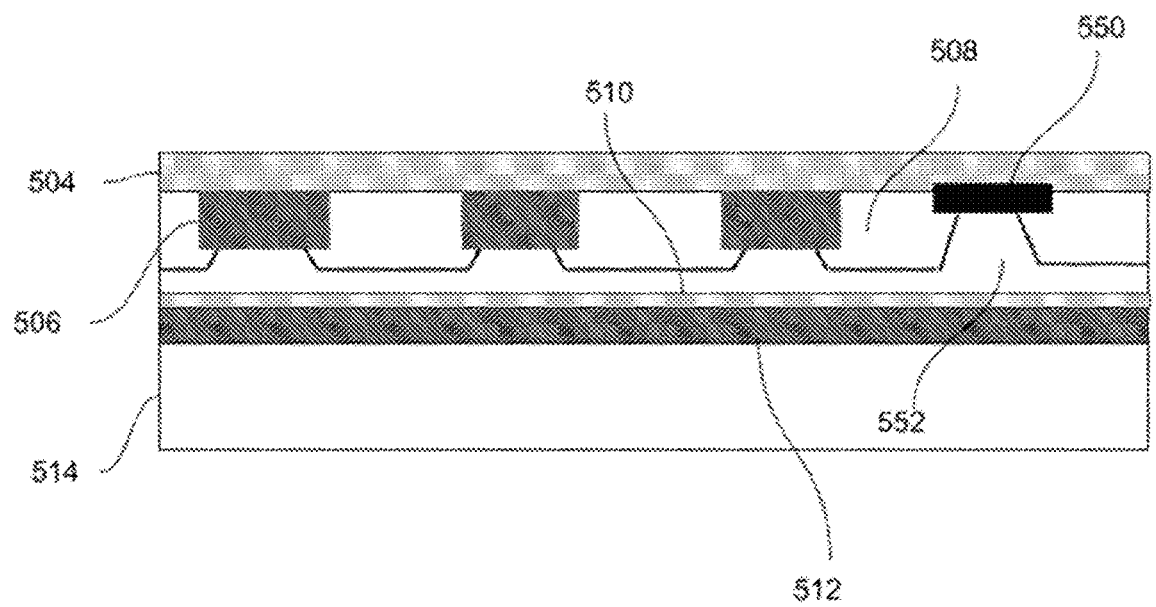
FIG. 5E is a cross-sectional view of a micro device array that includes a separation layer that is bonded to a backplane, according to one embodiment of the present invention.

The structure in FIGS. 5C and 5B may be transferred to another substrate or backplane 514 to either form a larger structure through tiling or offer other functionality such as mechanically flexibility as shown in FIGS. 5D and 5E. Here, the top surface of the structure in FIG. 5C or 5B is bonded to the top surface of the substrate 514. Adhesive may be applied to the top surface of substrate or structures in FIGS. 5B and 5C. Substrate 514 can have pixel circuit or metallization to further control the micro devices in the structure of FIGS. 5B and 5C.

Figure 5F:
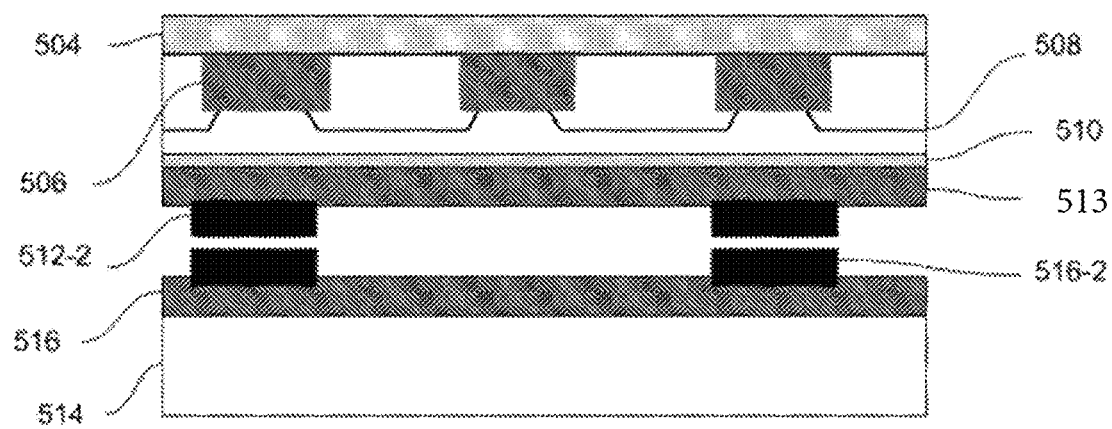
FIG. 5F shows another bonding approach where some pads from the structures of FIGS. 5B and 5C face the pads on the substrate.

FIG. 5F shows another bonding approach where some pads 512-2 from the structures of FIGS. 5B and 5C face the pads 516-2 on the substrate 514. Here, these pads pass some signals from the substrate to the structure. These signals may control the tiles (i.e., if a tiling structure is used) or control the components in the structure. Here, the pads 512-2 516-2 can be formed on a dielectric or buffer layer 513 or 516.

Figure 6A:
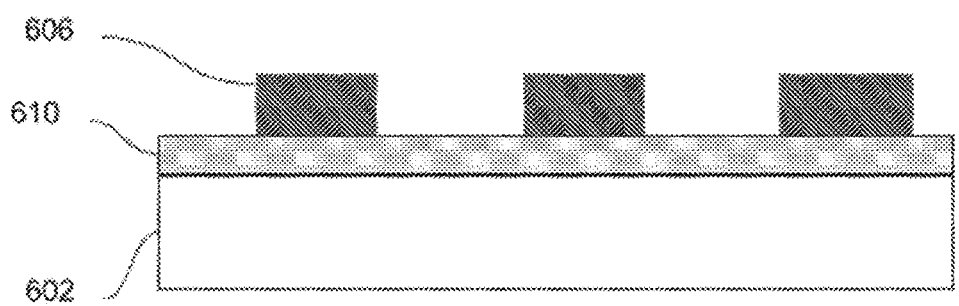
FIG. 6A is an alternate embodiment of a micro device array on a substrate, according to the present invention.

FIG. 6A is an alternate embodiment of the present invention which comprises a substrate 602. The substrate may be glass, sapphire, or some other material. A substrate layer 610 may be provided on the substrate. The backplane layer may include a buffer layer, micro device circuitry to control or drive micro devices, and metallization layers. One or more micro devices 606 may be formed or transferred onto the backplane 604. In one case, the microdevice driver circuitry is formed on the substrate layer 610 or microdevice tile before bonding to the backplane layer.

Figure 6B:
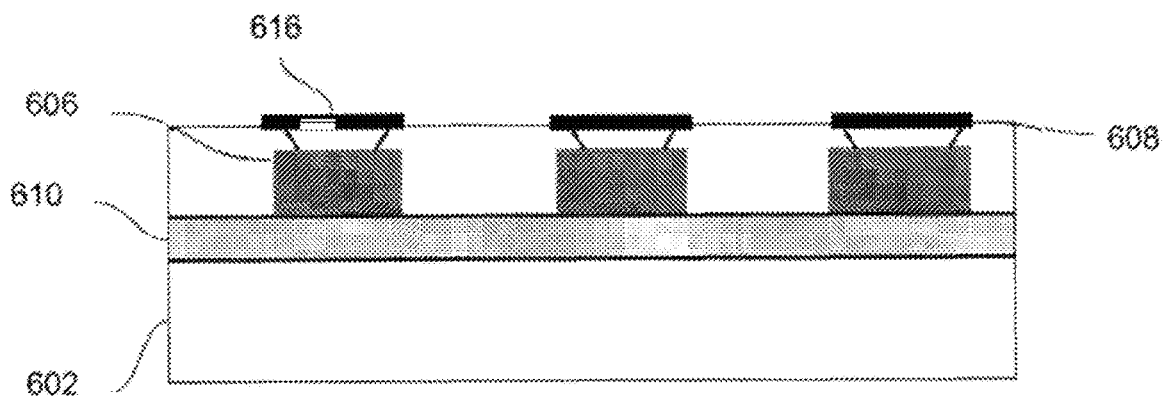
FIG. 6B is an alternate embodiment of a micro device array on a substrate with an optional electrode, according to the present invention.

With reference to FIG. 6B, one or more planarization layers 608 are formed on or over the micro devices 606. The planarization layer 608 may be made of organic insulating material and patterned to expose a top of the micro devices. In another case, the planarization layer may be etched to expose the top of the micro devices. An optional common electrode 616 may rest on top of the planarization layer(s) 608. The common electrode 616 may be patterned. Other layer(s) may be formed on top of the planarization layer such as color conversion, color filter, and so on.

Figure 6C:
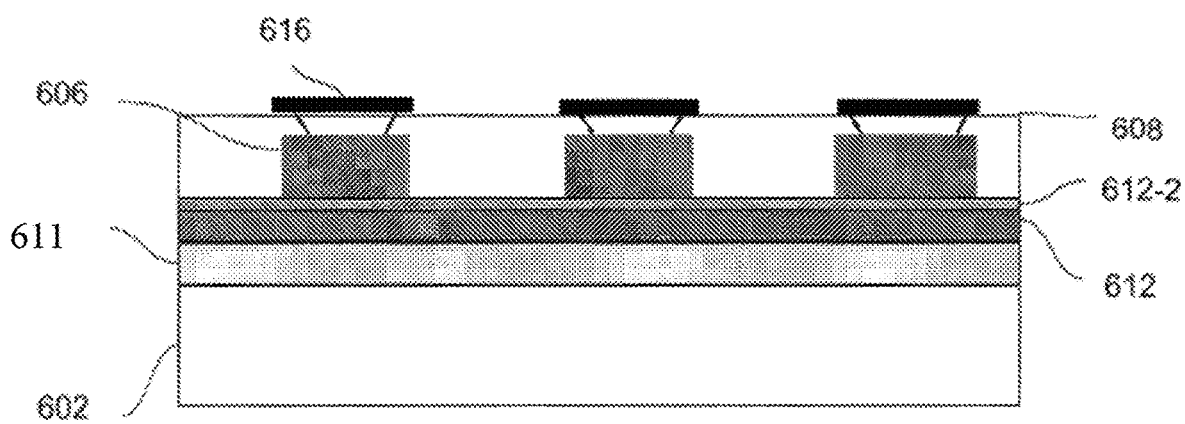
FIG. 6C shows an alternate structure of a micro device array that includes a separation layer, an optional electrode, and is bonded to a backplane, according to another embodiment of the present invention.

FIG. 6C is another embodiment of the present invention wherein a separation layer 612 is added between the micro device layer and the backplane layer 611. A buffer layer 612-2 may be formed on top of the separation layer 612. The separation layer 612 may optically or electrically isolate the micro devices 606 from the backplane layer 610. This layer may be but is not limited to a reflective, opaque, black matrix, or patterned layer.

Figure 6D:
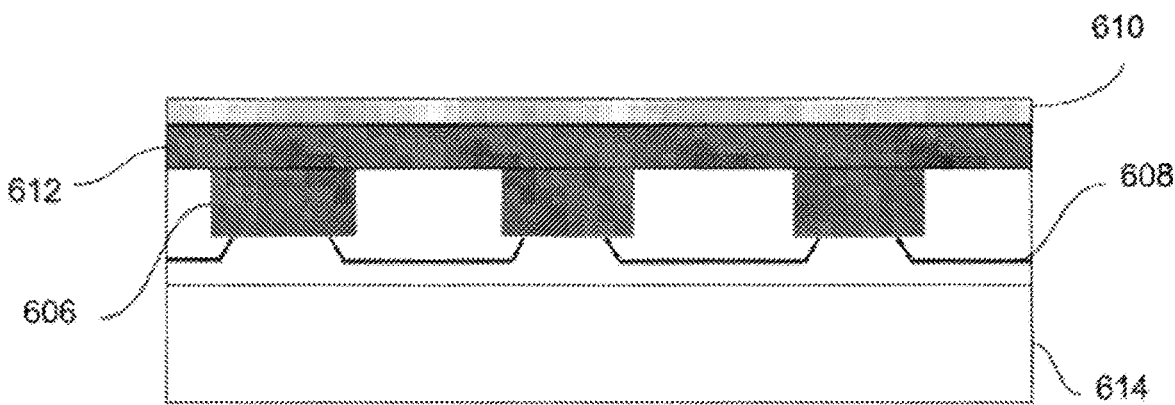
FIG. 6D shows an alternate embodiment of a micro device array on a tile that includes separation and adhesive layers.
Figure 6E:
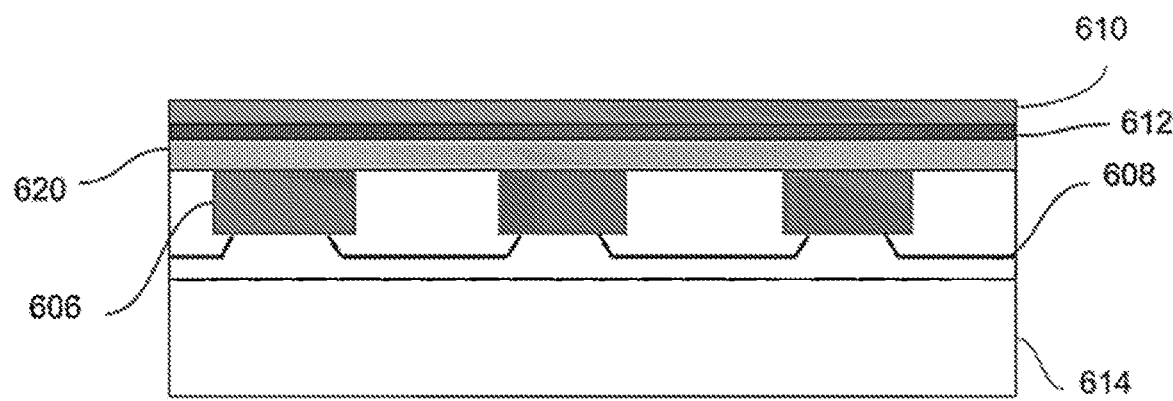
FIG. 6E shows another embodiment of a micro device array on a tile with a separation and adhesive layers.

The structure in FIGS. 6B and 6C can be transferred to another substrate or backplane 614 as demonstrated in FIGS. 6D and 6E. An adhesive layer 620 may be applied to the top surface of substrate 614 and the structure of FIG. 6B or 6C.

Figure 7A:
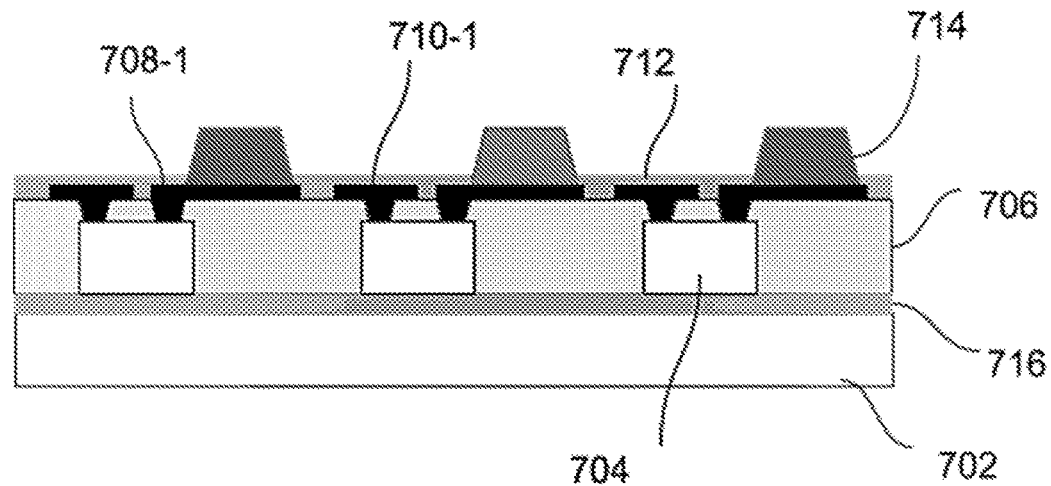
FIG. 7A shows an embodiment of a micro device array processed in a frontplane with metallization, pads, and electrodes.

FIG. 7A shows another embodiment where the micro devices are transferred onto a substrate 702. A buffer layer 716 may be formed on the substrate 702 before transferring the micro devices to the substrate. The micro devices 704 are planarized, and the planarization layer 706 is patterned to open a connection to the micro devices 704. In another case, the planarization layer 706 is etched back to expose the top of the micro devices 704. Here, an electrode is deposited and patterned to form a pad electrode 708-1 for the micro device. A pad can be formed on top of the electrode. Another electrode 710-1 (i.e., an metallization electrode) can be formed to create a common signal connecting to more than one micro device. A dielectric layer 712 can be formed to cover the common electrode and can cover part of the pad (or pad electrode 708-1). Part of the common signal may be open to create a common pad electrode. A common pad 714 can be formed on top of the common pad electrode 708-1. In one case, the buffer layer 716 can be a release layer or tile transferable substrate which can be separated from the main substrate that the buffer layer is formed on top of it.

Figure 7B:
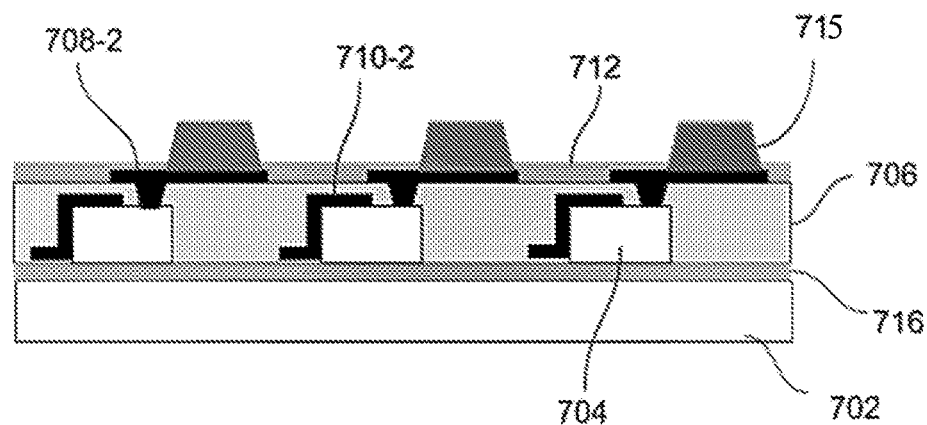
FIG. 7B shows an embodiment of micro device array processed in a frontplane with metallization.

FIG. 7B shows another embodiment where the common signal is formed on a different level than the pad electrode. Here, a dielectric layer 712 can be formed after the micro device transfer with an opening that provides access to the micro device contacts. The common signal 710-2 is formed to connect to a couple of micro devices 704. A planarization layer 706 is formed and the opening is formed in the planarization layer to expose a connection of micro devices and may expose the common pad electrode 708-2. The micro device pad electrode 708-2 is formed on top of the planarization layer and a micro device pad 715 can form on top of the micro device pad electrode. The dielectric layer 712 can be formed to cover part of the micro device pad electrode 708 or micro device pad.

In another case, the common signals can be formed in rows (or columns). A planarization or dielectric layer is formed, and second common signals are formed to connect the other micro device contacts in columns (or rows). In this case, there will be row common pads and column common pads.

Figure 7C:
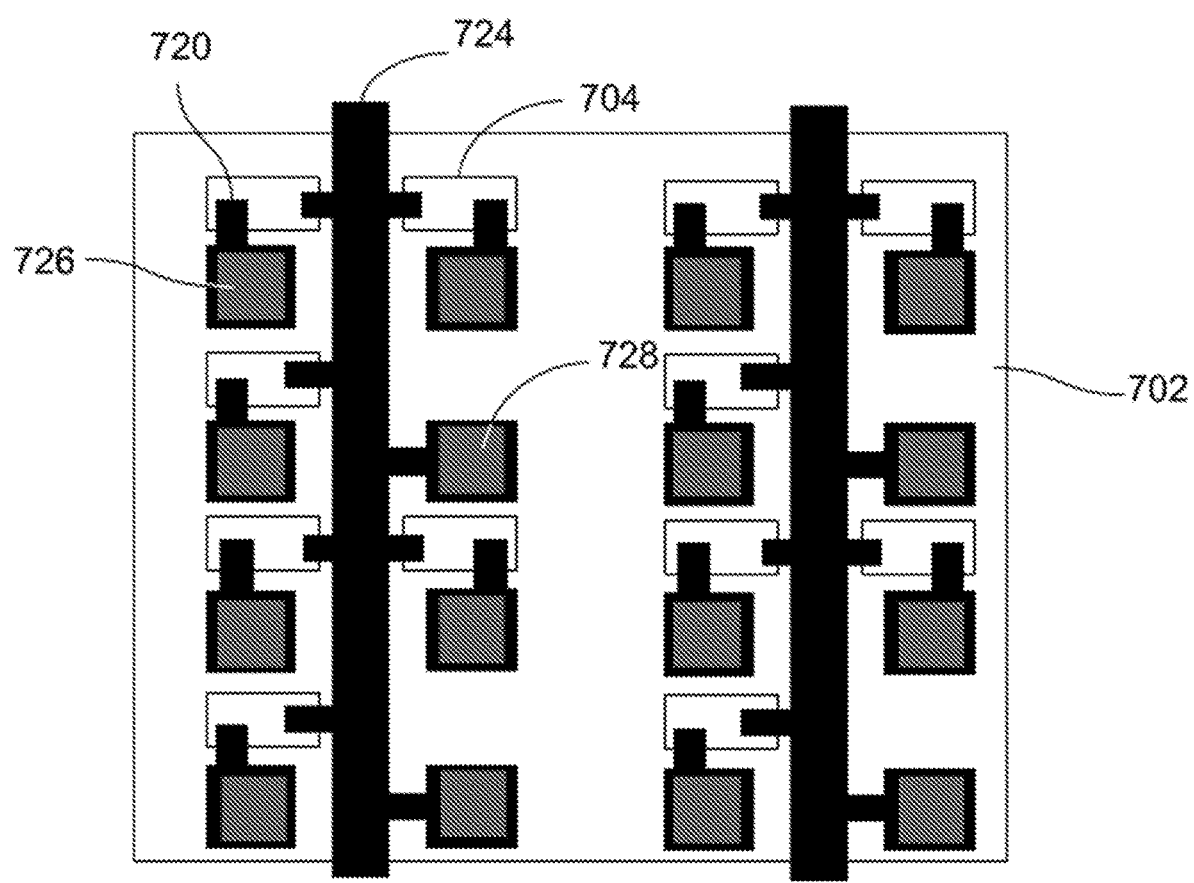
FIG. 7C shows a top view of exemplary metallization and pads for bonding.

FIG. 7C shows an exemplary top view of a micro device with micro device pads 726 and common pads 728 formed on top of the substrate 702. The common signals/connections 724 can be formed in rows (or columns). A planarization or dielectric layer is formed, and second common signals 720 are formed to connect the other micro device contacts in columns (or rows). In this case, there will be row common pads and column common pads.

Figure 7D:
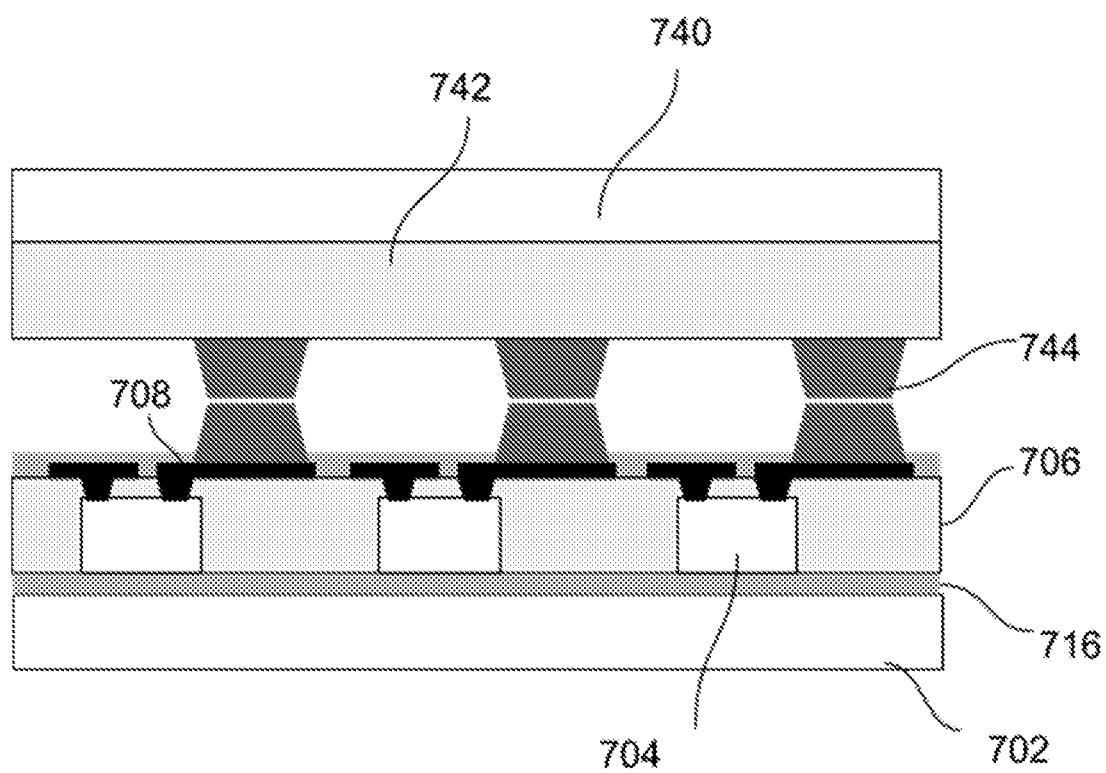
FIG. 7D shows an embodiment of a frontplane of a micro device array bonded to a backplane.

FIG. 7D shows an embodiment of a frontplane of a micro device array bonded to a backplane. The micro devices are transferred onto the substrate 702. A buffer layer 716 may be formed on the substrate 702 before transferring the micro devices to the substrate. The micro devices 704 are planarized, and the planarization layer 706 is patterned to open a connection to the micro devices 704. In another case, the planarization layer 706 is etched back to expose the top of the micro devices 704. A common pad 714 can be formed on top of the common pad electrode 708. A backplane 742 may be integrated to a backplane substrate 740 having pads 744. The backplane and the micro device substrate may be bonded together through backplane pads 744 and the common pads 714 of the substrate.

Figure 8A:
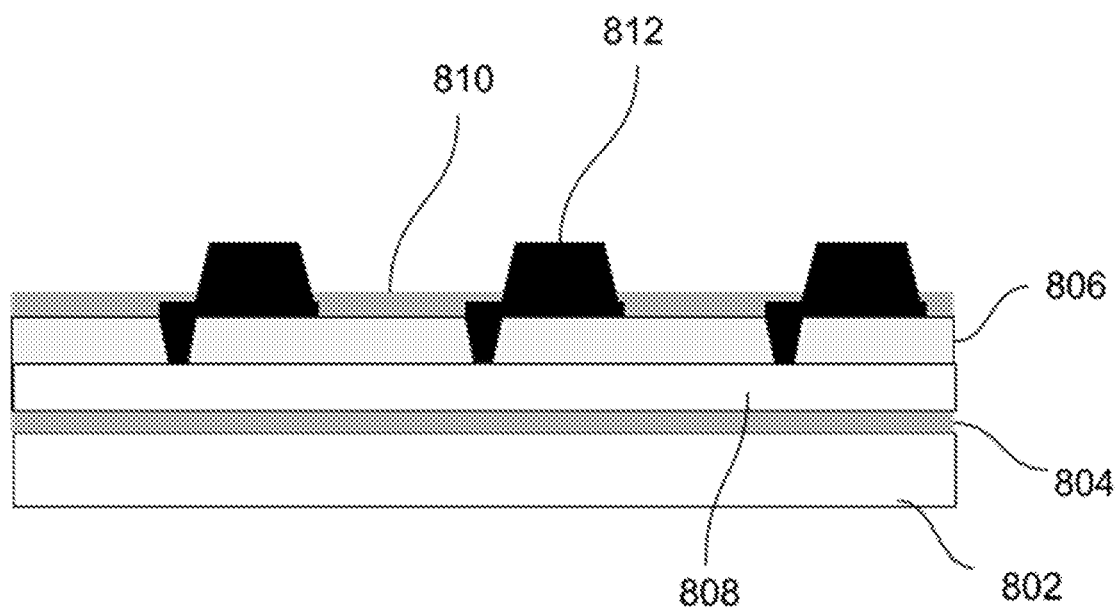
FIG. 8A shows an embodiment wherein the planarization layer is etched back to expose the top of the pixel driving circuit.

FIG. 8A shows an embodiment wherein the planarization layer is etched back or patterned to expose the top of pixel driving circuit. Here, a substrate 802 is provided. A buffer layer 804 may be formed on the substrate 802. The pixel driving circuits 808 may be provided on top of the buffer layer 804 to control or drive the micro devices. The pixel driving circuits are planarized, and the planarization layer 806 is patterned to open a connection to the pixel driving circuit. In another case, the planarization layer 806 is etched back to expose the top of pixel driving circuit 808. A plurality of pad 812 may be formed on top of the planarization layer 806. A dielectric layer 810 can be formed covering a part of the pad (or pad electrode 708). In another case, planarization layer can be a dielectric layer only.

Figure 8B:
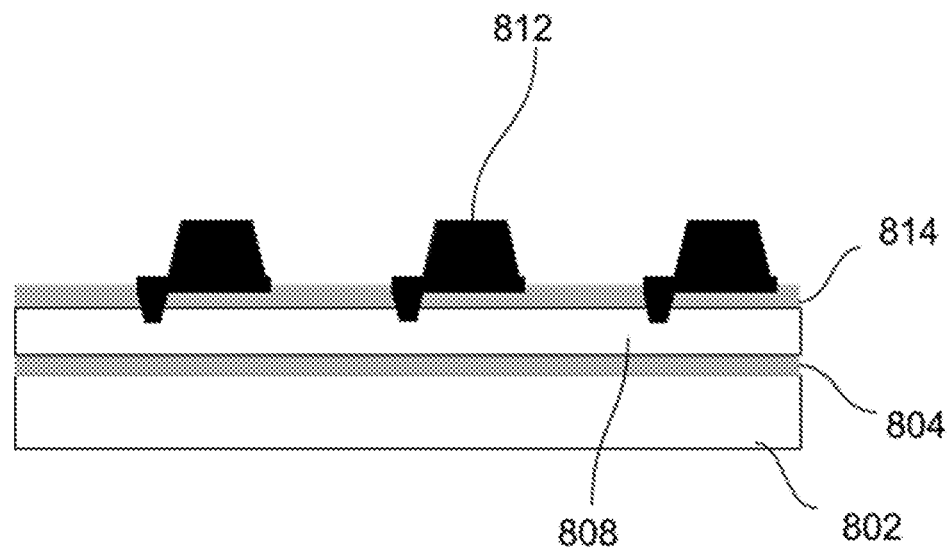
FIG. 8B shows an embodiment having a bank layer deposited over the pixel driving circuits.

FIG. 8B shows an embodiment having a bank layer which is a dielectric layer deposited over the pixel driving circuits. Here, a substrate 802 is provided. A buffer layer 804 may be formed on the substrate 802. The pixel driving circuits 808 may be provided on top of the buffer layer 804 to control or drive the micro devices. A bank layer may be provided and patterned to open a connection to the pixel driving circuit. A plurality of pad 812 may be formed on top of the bank layer through the openings. The pads 812 can be formed on a dielectric or buffer layer 814.

In the above embodiment, the buffer layer 804 can be a release layer or tile transferable substrate which can be separated from the main substrate that the buffer layer is formed on top of it.

According to one embodiment, there may be provided a method of making a tiled display. The method may comprise providing a tile substrate having a plurality of tiles, providing a backplane layer, covering a first surface of one of the backplane or the tile substrate with an adhesive, aligning and releasing the tiles to the backplane; and curing the adhesive.

According to yet another embodiment, the method may further comprise providing a buffer layer on a top surface of the tile substrate or the backplane layer. The buffer layer may be reflective or transparent. An area between the plurality of tiles and micro devices is filled with a filler layer, wherein the filler layer is extended to either side of the tile depending on the view direction.

According to some embodiments, the metallization for traces and bridges is formed between the tiles over the filler layer. The filler layer is a black matrix or transparent material.

According to yet another embodiment, the method may further comprising depositing a dielectric layer on a top surface of the tiles, providing openings through the dielectric layer to provide the metallization or traces and bridges formed between the tiles, aligning the tiles to the backplane comprising aligning contact pads of the tile substrate to contact pads on a surface of the backplane. The contacts pads of the tile substrate are connected to signal lines to pass the signals between or through the tiles.

According to some embodiments, releasing the tiles to the backplane comprises applying pressure to the tiles to release on the surface of the backplane.

According to one embodiment, where microdevice driver circuit is formed on the microdevice tile before bonding to the backplane substrate.

According to another embodiment, there may be provided a tiled display. The tiled display may comprise one or more micro devices transferred to a substrate; and a passthrough pad formed on a top surface of the substrate to pass a backplane to the top surface.

According to another embodiment, the tiled display may further comprise a planarization layer formed and patterned to expose a top surface of the one or more micro devices, a protection layer formed on the planarization layer, and a separation layer formed between the micro devices and the backplane. The separation layer is one of reflective, opaque, black matrix, or a patterned layer.

According to yet another embodiment, a tiled display may be provided. The tiled display comprising one or more micro devices transferred to a substrate, a patterned planarization layer to provide openings for connecting the micro devices, a pad electrode deposited and patterned on or over the micro devices; and a common pad formed on a top surface of the pad electrode.

According to some embodiments, the tiled display may further comprise an metallization electrode formed to create a common signal and a dielectric layer covering the pad electrode and a part of the common pad.

The foregoing description of one or more embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

The invention claimed is:

1. A method of making a tiled display by reducing a tile visibility comprising:
   providing a tile substrate having a plurality of tiles with pixels;
   providing a backplane layer;
   covering a first surface of one of the backplane layer or the tile substrate with an adhesive;
   aligning and releasing the plurality of tiles to the backplane;
   curing the adhesive;
   having trenches, provided on at least one of the tiles of the plurality of tiles, each of the trenches being provided between the pixels on a respective one of the plurality of tiles, wherein the trenches have a same width as a space between two tiles of the plurality of tiles; and
   filling the trenches on the at least one of the tiles of the plurality of tiles between the pixels and the space between the two tiles with a same filler layer, wherein the filler layer is extended to a side of at least one of the two tiles of the plurality of tiles.

2. The method of claim 1, further comprising providing a buffer layer on a top surface of the tile substrate or the backplane layer.

3. The method of claim 1, wherein the buffer layer is reflective or transparent.

4. The method of claim 1, wherein the filler layer is reflective and patterned before or after the tiled display is assembled.

5. The method of claim 4, wherein the trenches have a set pattern.

6. The method of claim 1, wherein the trenches are implemented at a surface closer to the micro devices when the micro devices are configured at a bottom side of the tiles.

7. The method of claim 1, wherein the filler layer includes an opaque material for occluding light from passing through the filler layer.

8. The method of claim 1, wherein metallization for traces and bridges is formed between the tiles over the filler layer.

9. The method of claim 1, wherein the filler layer includes at least one of a black matrix and a transparent material to reduce a light outcoupling.

10. The method of claim 1, wherein the filler layer includes at least one of a black matrix and a transparent material to reduce a tile visibility.

11. The method of claim 1, further comprising depositing a dielectric layer on a top surface of the tiles.

12. The method of claim 1, further comprising providing openings through the dielectric layer to provide metallization for at least one of traces and bridges formed between the tiles.

13. The method of claim 1, wherein aligning the tiles to the backplane comprises aligning contact pads of the tile substrate to contact pads on a surface of the backplane.

14. The method of claim 13, wherein contacts pads of the tile substrate are connected to signal lines to pass the signals between or through the tiles.

15. The method of claim 1, wherein releasing the tiles to the backplane comprises applying pressure to the tiles to release on the surface of the backplane.

16. The method of claim 1, where a micro device driver circuit is formed on the micro device tile before bonding to the backplane substrate.

\* \* \* \* \*